(12) United States Patent
Hackl

(10) Patent No.: US 11,774,918 B2
(45) Date of Patent: Oct. 3, 2023

(54) ELECTRIC CIRCUIT ARRANGEMENT FOR STANDARD INSULATION MONITORING WITH EMERGENCY SHUT-DOWN FOR AN UNGROUNDED POWER SUPPLY SYSTEM UPON DETECTION OF A GROUND FAULT

(71) Applicant: Bender GmbH & Co. KG, Gruenberg (DE)

(72) Inventor: Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 17/829,942

(22) Filed: Jun. 1, 2022

(65) Prior Publication Data

US 2022/0390907 A1 Dec. 8, 2022

(51) Int. Cl.
*G05B 9/02* (2006.01)
*G01R 31/08* (2020.01)

(52) U.S. Cl.
CPC .............. *G05B 9/02* (2013.01); *G01R 31/083* (2013.01); *G01R 31/088* (2013.01)

(58) Field of Classification Search
CPC ...... G05B 9/02; G01R 31/083; G01R 31/088; G01R 31/52; G01R 27/18
USPC ........................................................ 324/523
See application file for complete search history.

(56) References Cited

U.S. PATENT DOCUMENTS

2011/0075304 A1* 3/2011 Hamer .................. H02H 7/263
361/47

FOREIGN PATENT DOCUMENTS

| DE | 19837933 A1 | 3/2000 |
| DE | 102011084362 B4 | 3/2015 |
| DE | 102015207456 B3 | 9/2016 |
| DE | 102019006646 A1 | 9/2020 |
| EP | 2848949 A1 | 3/2015 |
| WO | 2014131768 A1 | 9/2014 |

* cited by examiner

*Primary Examiner* — Farhana A Hoque
(74) *Attorney, Agent, or Firm* — Dickinson Wright PLLC; Andrew D. Dorisio

(57) ABSTRACT

The invention relates to an electric circuit arrangement (2) for standard insulation monitoring with emergency shut-down for an ungrounded power supply system (4) upon detection of a ground fault, having a standard insulation monitoring device (10) which is coupled to an active conductor (L1, L2, L3) of the power supply system (4) on the network side via a coupling branch (12) each or to a neutral point (S) of the power supply system (4) via a coupling branch (12) and is connected to ground (PE) on the ground side via a ground connection branch (14). The electric circuit arrangement (2) comprises an AC/DC sensitive measuring current transformer (20) which detects a fault current on the network side at the active conductors (L1, L2, L3) in the coupling branches (12) or at the neutral point (S) in the coupling branch (12) or on the ground side in the ground connection branch (14) of the insulation monitoring device (10); an evaluator (30) for evaluating the fault current with regard to a fault current threshold being exceeded; and a trip device (40) for shutting down the power supply system (4).

3 Claims, 9 Drawing Sheets

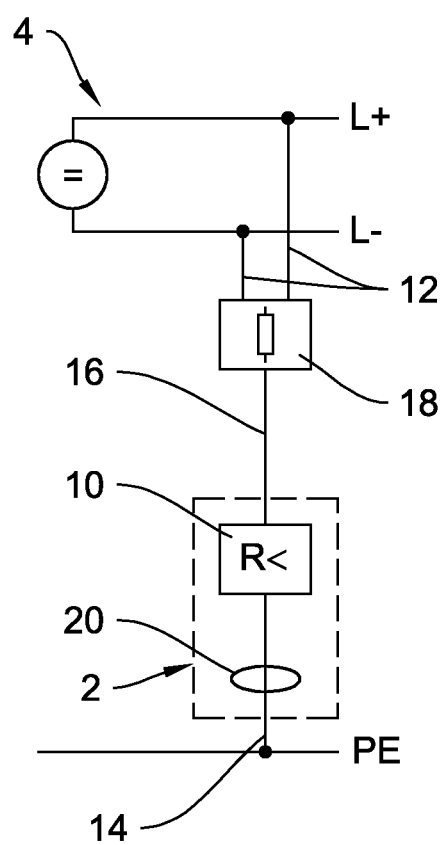 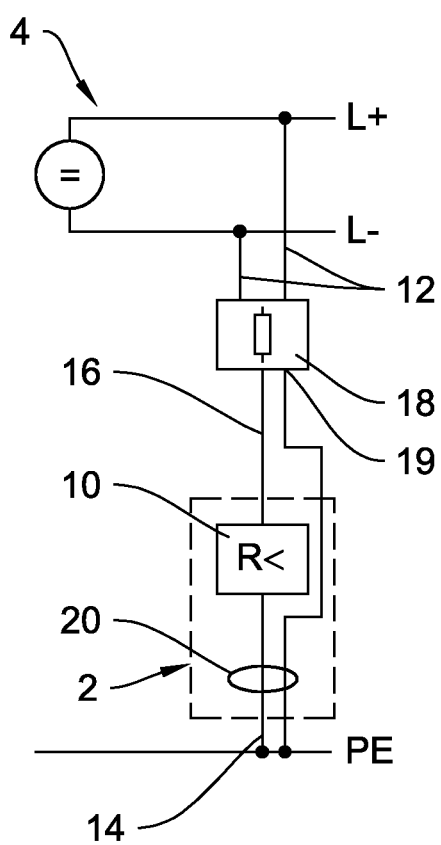
Fig. 4d  Fig. 4e

ELECTRIC CIRCUIT ARRANGEMENT FOR STANDARD INSULATION MONITORING WITH EMERGENCY SHUT-DOWN FOR AN UNGROUNDED POWER SUPPLY SYSTEM UPON DETECTION OF A GROUND FAULT

This application claims priority to German Patent Application No. 10 2021 114 260.1 filed on Jun. 2, 2021, the disclosure of which is hereby incorporated by reference.

TECHNICAL FIELD

The invention relates to an electric circuit arrangement for standard insulation monitoring with emergency shut-down for an ungrounded power supply system upon detection of a ground fault, having a standard insulation monitoring device which is coupled to an active conductor of the power supply system on the network side via a coupling branch each or to a neutral point of the power supply system via a coupling branch and is connected to ground on the ground side via a ground connection branch.

BACKGROUND

In order to supply power to electric operating means, the network configuration of an ungrounded power supply system is used when higher requirements are made to operational, fire and touch safety. This network configuration is also referred to as an insulated network, IT network or IT power supply system (French: isolé terre—IT).

The advantage of the IT networks lies in the fact that the function of the electric operating means is not impaired when a first insulation fault, such as a ground fault or a fault to frame, occurs since a circuit cannot become completed because of the ideally infinitely large impedance value between active conductors (outer conductor and neutral conductor) of the ungrounded power supply system and ground in this first (insulation) fault.

Owing to the inherent safety of the IT power supply system, a continuous power supply of the operating means connected to the IT power supply system, i.e., of the consumers fed by the IT power supply system, can be ensured even if a first insulation fault occurs.

According to standard IEC-61557-8, the electric resistance of the IT power supply system to ground (insulation resistance—in the event of a fault also referred to as an insulation fault, insulation fault resistance or fault resistance) is therefore continuously monitored by an insulation monitoring device (IMD), which is coupled between one or more active conductors and ground or between a neutral point of the IT power supply system and ground (functional grounding), since a fault loop would arise due to another possible fault at a different active conductor (second fault); the flowing fault current along with an overcurrent protective device would lead to a shut-down of the installation with a complete operational standstill.

When applied in low-voltage ranges, in which the IT power supply system is used, the goal generally is to continue the unimpaired operation of the installation in the event of a first ground fault according to the purpose of the IT network.

When it comes to specific applications in low-voltage ranges and especially to applications in medium-voltage ranges, in which the IT power supply system is used, the demand to shut down the electric installation or at least affected faulty installation parts as quickly as possible as soon as a first insulation fault arises, which causes a displacement voltage deemed critical in this situation, while considering applicable standards exists in specific operational settings in variation to the general application principle of the IT power supply system.

According to the state of the art, ground fault monitors or ground fault relays are used for the most part in these installations in cases of a simple ground fault to fulfill the requirement of a quick shut-down.

No product standards exist for these devices and different models are available on the market which function according to different methods.

What all these ground fault monitors and ground fault relays have in common, however, is that they do not comply with the requirements to a standard insulation monitoring device according to standard IEC-61557-8 and thus cannot identify slowly arising symmetrical insulation faults, for example.

In modern electric installations in both low-voltage ranges and medium-voltage ranges, which are based on the ungrounded network configuration, parallel implementation of both monitoring functions is required more and more, i.e., the parallel implementation of insulation monitoring according to standard IEC-61557-8 and a ground fault monitoring function, which ensures an emergency shut-down of the installations or installation parts when a critical operating state has been identified, without the two monitoring tasks interfering with each other.

DE 10 2015 207 456 B3 discloses an insulation monitoring device and a method for standard monitoring of an insulation resistance of an ungrounded single-phase or multiphase power supply system. The insulation monitoring device additionally comprises a voltage monitoring circuit in order to continuously detect the conductor voltage with respect to the ground potential for at least one active conductor. If a voltage increase is registered at an active conductor in this case, the voltage monitoring circuit generates a shut-down signal to shut down the power supply system.

By means of such an insulation monitoring device upgraded by a voltage monitoring circuit, thus making it a specific insulation monitoring device, the demand for standard insulation monitoring combined with a type of ground fault monitoring function can be fulfilled.

EP 2 848 949 A1 discloses a method and a device in which an insulation monitoring function is combined with a type of ground fault monitoring function. Owing to the special feature of the synchronization with the network frequency of the IT system to be monitored, the application of this method is limited to purely AC IT systems having a relatively small admissible network leakage capacitance.

A disadvantage of the known methods and devices is that the ground fault monitoring function in combination with any standard insulation monitoring device possibly already installed in the installation cannot be retrofitted according to standard IEC-61557-8. The corresponding implemented (measuring) channels and signal processing paths for the insulation monitoring on the one hand and the ground fault monitoring function on the other hand are not independent of one another since the known methods and devices represent made-to-measure solutions for specific application cases. The ground fault monitoring function, which is based on measuring the voltage of an active conductor to ground in a shared device, would also lead to higher requirements to the insulation coordination in a combined device in particular for power supply systems having higher nominal voltages, e.g., for medium-voltage systems to be monitored.

SUMMARY

The object of the invention at hand is therefore to combine standard insulation monitoring with ground fault identification in such a manner that both safety measures are effective independently of each other without negatively interfering with each other in their functionality, meaning that retrofitting standard insulation monitoring via ground fault identification becomes possible in a simple manner in terms of circuitry.

This object is attained in combination with the features of the preamble of claim 1 in that the electric circuit arrangement comprises an AC/DC sensitive measuring current transformer which detects a fault current on the network side at the active conductors in the coupling branches or at the neutral point in the coupling branch or on the ground side in the ground connection branch of the insulation monitoring device; an evaluator for evaluating the fault current with regard to a fault current threshold being exceeded; and a trip device for shutting down the power supply system.

The starting point of the observations is the product standard IEC-61557-8 which is applicable to insulation monitoring devices and states the requirement that the internal resistance Ri as well as the alternating-current internal impedance Zi of the insulation monitoring device must be at least 30 Ohm/V of the network nominal voltage.

Owing to this requirement, the current flow is limited to below 33 mA at an active conductor of the IT power supply system to be monitored independently of the nominal voltage and of the frequency in the coupling branch(es)/the ground connection branch of the insulation monitoring device when a low-impedance ground fault arises. The coupling branch(es) form(s) a measuring branch together with the ground connection branch, the standardly limited fault current being detected in the measuring branch by the measuring current transformer switched in series with the insulation monitoring device.

According to the invention, the current limitation mandated by the standard is used to implement small and inexpensive AC/DC sensitive measuring current transformers as current sensors for detecting ground faults and thus as base elements for the ground fault monitoring function. The measuring current transformers allow a galvanically isolated and completely autonomous detection of a ground fault state via an AC/DC sensitive detection of a fault current in the coupling branch(es) or in the ground connection branch of the insulation monitoring device.

Starting from the specifications relevant to circuitry when disposing the insulation monitoring device, which are determined by the type of current (alternating current (AC), direct current (DC)), the type and number of conductors (single-phase or multiphase power supply system, with or without a carried neutral conductor) and by structural circumstances (control cabinet), different options are available for installing the measuring current transformer in the measuring branch, which consists of the coupling branch(es) and the ground connection branch, in series with the insulation monitoring device.

According to the invention, the measuring current transformer is generally disposed in such a manner on the network side that the entire fault current flowing through all coupling branches is detected. This applies to ungrounded alternating-current power supply system and to ungrounded direct-current power supply systems.

Alternatively thereto, the measuring current transformer is disposed in a three-phase alternating-current power supply system having an accessible neutral point in the coupling branch leading to the neutral point.

In another embodiment, the measuring current transformer—for ungrounded alternating-current power supply systems and ungrounded direct-current power supply systems—is disposed on the ground side in the ground connection branch of the insulation monitoring device.

In all constellations, the measuring current transformer detects the entire fault current, which is dissipated to ground via the active conductors of the power supply system.

The electric circuit arrangement further comprises an evaluator for evaluating the fault current with regard to a fault current threshold being exceeded and a trip device for shutting down the power supply system.

The ground fault monitoring based on the AC/DC sensitive measuring current transformer takes place in interaction with a suitable evaluator and a trip device so that an emergency shut-down of the power supply system to be monitored is implemented when the fault current threshold is exceeded.

Preferably, the evaluator and the trip device are designed such that the requirements regarding the shut-down times of an automatic shut-down of the power supply system as a fault protection, as demanded in standard IEC-60364-4-41 for establishing low-voltage installations in part 4:41: protective measures—protection from electric shock (section 411), are fulfilled. This would be the case for example by using a residual-current monitoring module (MRCD) according to standard IEC-60947-2.

Since the insulation against the electrical potential of the IT power supply system to be monitored is determined by the solid insulation of the monitored active conductor and the distance of the monitored active conductor to the AC/DC sensitive measuring current transformer, the ground fault monitoring can be retrofitted by means of an AC/DC sensitive measuring current transformer independently of the nominal voltage level using constructive measures and independently of the type of the used insulation monitoring device.

From the electric circuit arrangement according to the invention, which comprises the standard insulation monitoring device for insulation monitoring and the AC/DC sensitive measuring current transformer for ground fault detection with emergency shut-down via the evaluator and the trip device as its main components, the following advantageous technical effects are derived, namely:

that the insulation monitoring and the additional ground fault monitoring do not interfere with each other in their respective functionality;

that any insulation monitoring devices available on the market take over the function of insulation monitoring as intended for them and the AC/DC sensitive ground fault monitoring function with emergency shut-down can be easily retrofitted;

the ground fault monitoring function offers increased reliability and a higher flexibility in the design of the ground fault monitoring function because it has separate diverse channels;

the ground fault monitoring is AC/DC sensitive, i.e., it can be used for direct-current power supply systems (DC) and for alternating-current power supply systems (AC);

that the ground fault monitoring can be configured with varying sensitivity for DC and different AC frequency ranges;

that the ground fault monitoring function does not lead to higher requirements to insulation coordination of the insulation monitoring device even for medium-voltage systems;

that the ground fault monitoring function does not lead to higher requirements to insulation coordination of the AC/DC sensitive measuring current transformer even for medium-voltage systems;

that the ground fault monitoring function can be designed so quickly, if required, that a preventive automatic shut-down of the power supply at a shut-down time of less than 5 s can be maintained in the event of a ground fault, as is mandated, for example, in IEC-60364-4-41 in section 411 for the automatic shut-down of the power supply as a fault protection;

that besides an additional protection for the monitored IT power supply system, an additional protection for the insulation monitoring device and/or a coupling device can be realized in the event that these components are operated outside of their specification.

In another advantageous embodiment, the measuring current transformer detects the fault current in the ground connection branch of the insulation monitoring device or in a connecting line when using a coupling device, which is coupled to the active conductors in the coupling branches or to the neutral point in the coupling branch and is connected to the insulation monitoring device via the connecting line.

In IT power supply systems which have a nominal voltage which is above the insulation coordination of the used insulation monitoring device, i.e., in the medium-voltage range, coupling devices are used which ensure that the requirements mandated by standard IEC-61557-8 are adhered to, meaning that the internal resistance Ri of the insulation monitoring device must be at least 30 Ohm/V of the nominal voltage and the alternating-current internal impedance Zi of the insulation monitoring device also must be at least 30 Ohm/V of the nominal voltage.

In order to detect the entire fault current, which is dissipated via the active conductors of the power supply system and to ground via the coupling device, the measuring current transformer is disposed in the ground coupling branch or in the connective line between the IMD and the coupling device.

The ground fault monitoring, which can be retrofitted according to the invention and has an AC/DC sensitive measuring current transformer, can additionally serve to ensure that the current-limiting function of the coupling device can still be fulfilled even at high network nominal voltages and that the power supply is automatically shut down when a critical current, which could lead to a collapsing of the insulation of the insulation monitoring device, is exceeded.

Preferably, when using a coupling device having a coupling-device ground connection (functional grounding), the measuring current transformer additionally detects a coupling-device fault current flowing via the coupling-device ground connection when detecting the fault current in the ground connection branch of the insulation monitoring device.

Some coupling devices have a voltage limitation via the internal resistance or the internal impedance in addition to the current limitation and its own coupling-device ground connection for this purpose.

The fault current arising from a ground fault and passing through the coupling device is divided onto the two functional grounding connections of the insulation monitoring device and the coupling device when a coupling-device ground connection is present. In order to correctly detect the entire fault current passing through the coupling device when conducting a measurement, the invention intends for both the ground coupling branch of the insulation monitoring device and the coupling-device ground connection to be monitored in an AC/DC sensitive manner via the measuring current transformer.

This is advantageous since the voltage level is on the same level as the ground potential in this instance and thus no particular requirements are made to insulation coordination of the AC/DC sensitive measuring current transformer.

BRIEF DESCRIPTION OF THE DRAWINGS

Further advantageous embodiment features are derived from the following description and the drawings, which explain a preferred embodiment of the invention by means of examples.

FIGS. 4a to 4e show retrofittable arrangements of a measuring current transformer in DC power supply systems;

DETAILED DESCRIPTION

Figure 6:
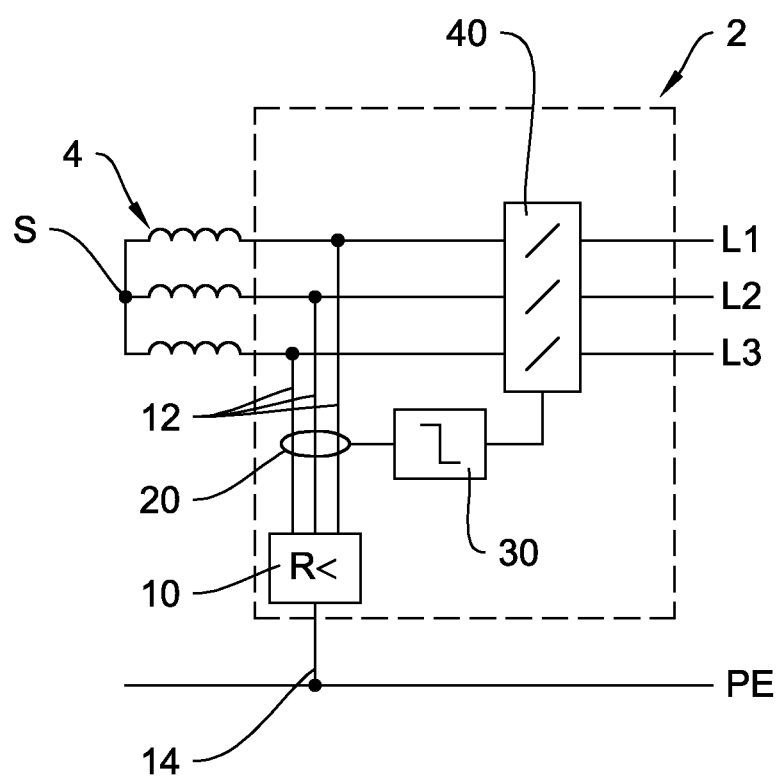
FIG. 6 shows an electric circuit arrangement according to the invention having a standard insulation monitoring device, a measuring current transformer, an evaluator and a trip device.

Using the example of a three-phase alternating-current power supply system 4, FIG. 6 shows an electric circuit arrangement 2 according to the invention which consists of a standard insulation monitoring device 10, an AC/DC sensitive measuring current transformer 20, an evaluator 30 and a trip device 40.

Insulation monitoring device 10 is coupled to each active conductor L1, L2, L3 of power supply system 4 via a coupling branch 12 each and to ground PE via a ground connection branch 14.

Measuring current transformer 20 is preferably designed as a current sensor having a toroid, the toroid encircling all coupling branches 12 in order to encircle the entire fault current dissipated to ground PE by power supply system 4.

The measurement result of measuring current transformer 20 is supplied by an evaluator 30 which controls trip device 40 when a fault current threshold is exceeded, trip device 40 shutting down power supply system 4 to be monitored.

FIGS. 1 to 5 show different retrofittable arrangement options of measuring current transformer 20 in different power supply systems specified by the type of current (AC, DC) and the type and number of conductors. To simplify the drawing, evaluator 30 and trip device 40 are not illustrated in FIGS. 1 to 5; in reality, electric circuit arrangement 2, as illustrated in FIG. 6, always comprises these components.

FIGS. 1a to 1f focus on possible retrofittable arrangements of measuring current transformer 20 in alternating-current power supply systems 4.

Figure 1C:
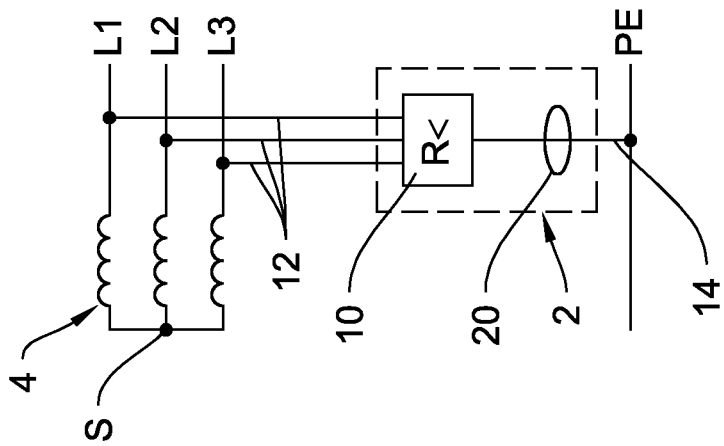
FIGS. 1a to 1f show retrofittable arrangements of a measuring current transformer in 3AC and AC power supply systems.
Figure 1B:
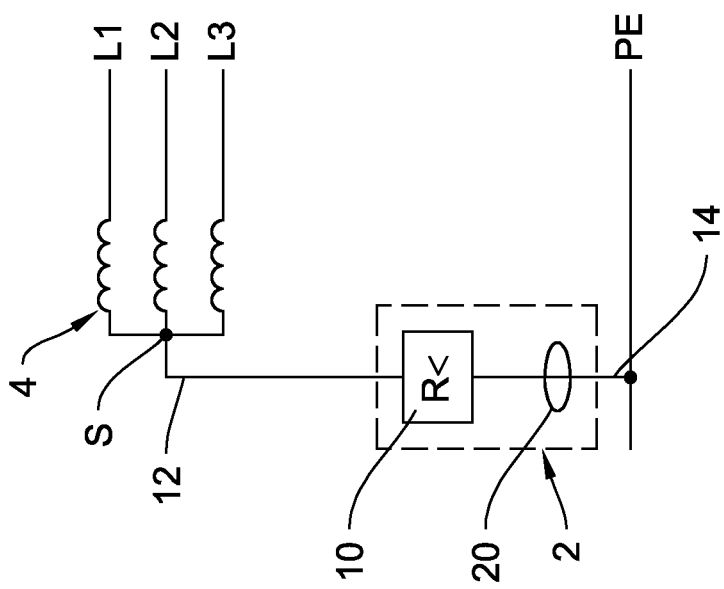
Figure 1A:
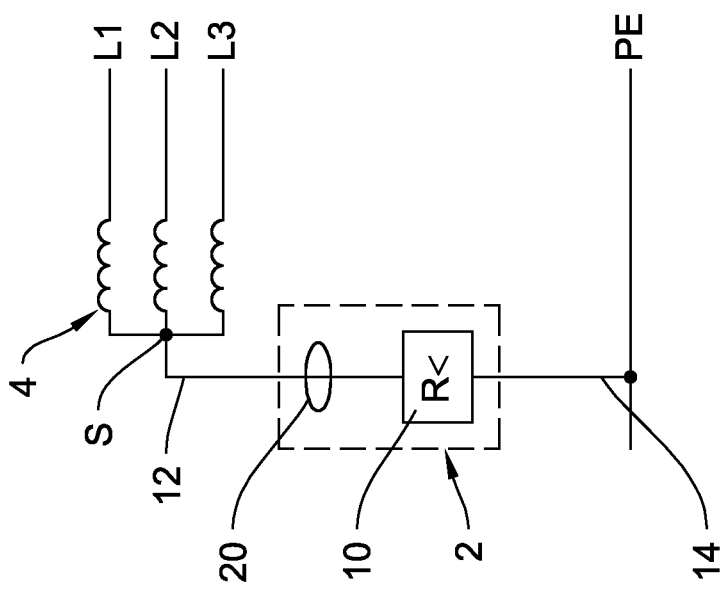
Figure 1F:
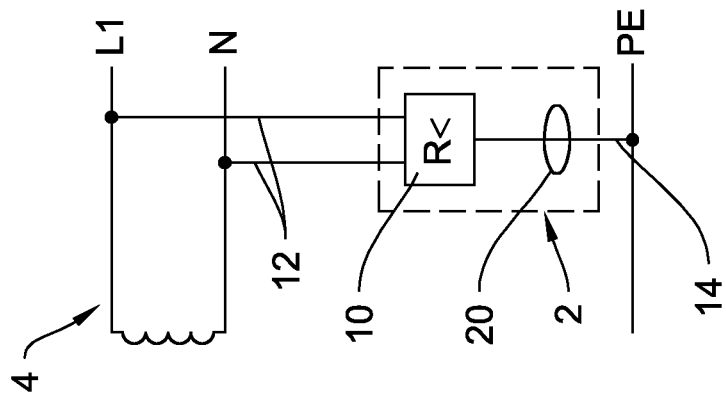
Figure 1E:
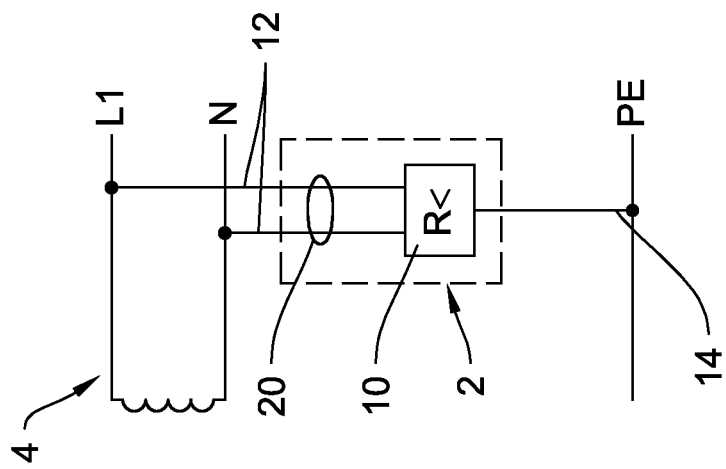

FIGS. 1a and 1b show a three-phase alternating-current power supply system 4 having an accessible neutral point S, measuring current transformer 20 either being disposed in coupling branch 12 (FIG. 1a) or in ground connection branch 14 of insulation monitoring device 10 (FIG. 1b).

Figure 1D:
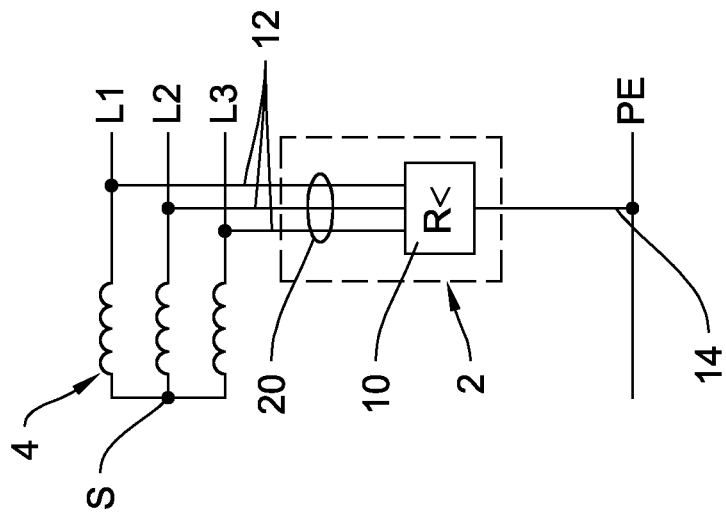

Alternatively thereto, for example when a neutral point S is inaccessible and thus insulation monitoring device 10 has to be directly connected to each active conductor L1, L2, L3 of power supply system 4 via a coupling branch 12 each, measuring current transformer 20 is disposed in ground connection branch 14 (FIG. 1c) or in all three coupling branches 12 by encircling said coupling branches 12 (FIG. 1d).

Analogously in a single-phase alternating-current power supply system 4, disposing measuring current transformer 20 in both coupling branches 12 (FIG. 1e) or in ground connection branch 14 (FIG. 1f) is possible.

FIG. 2 shows a retrofittable arrangement of measuring current transformer 20 in 3AC and AC power supply systems 4 in which a coupling device 18 is connected to active conductors L1, L2, L3 or L1, N, respectively, "before" insulation monitoring device 10.

Figure 2C:
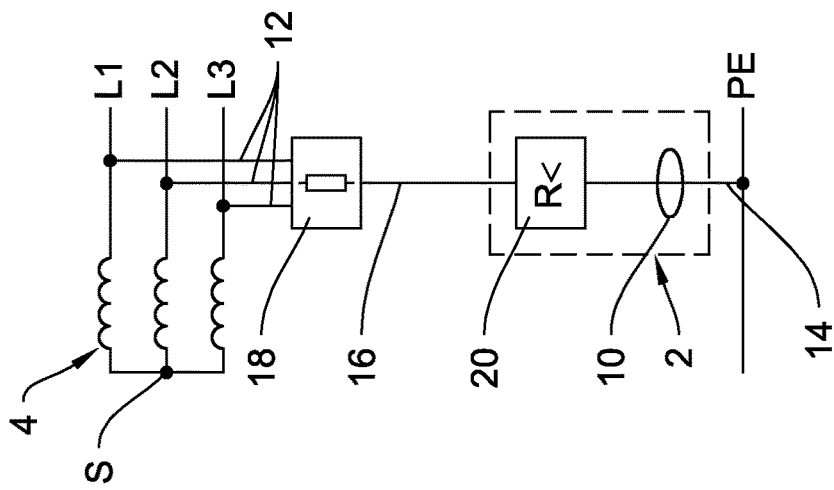
FIGS. 2a to 2f show retrofittable arrangements of a measuring current transformer in 3AC and AC power supply systems having a coupling device.
Figure 2B:
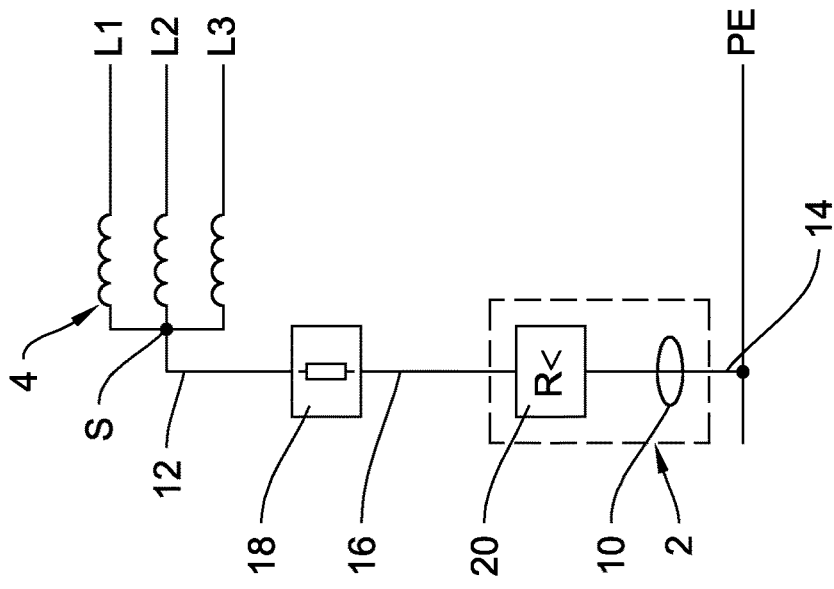
Figure 2A:
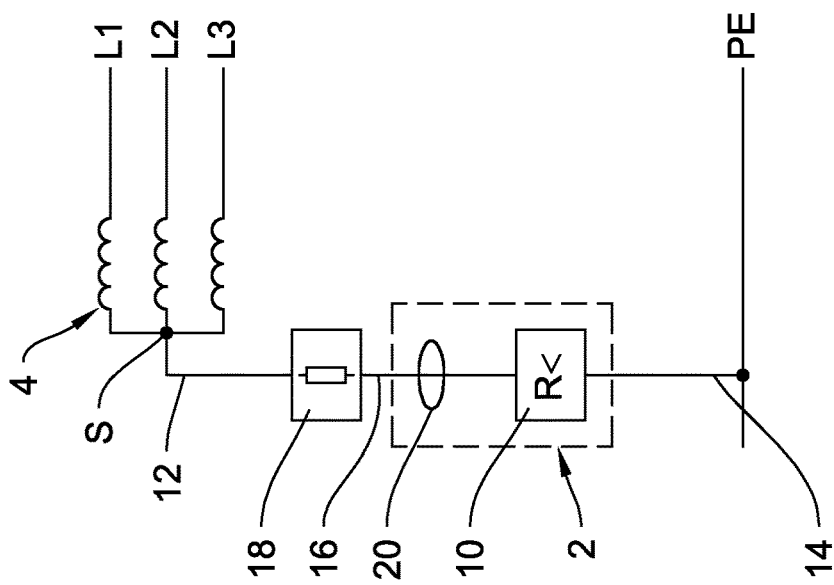

When neutral point S is accessible, measuring current transformer 20 is disposed in a three-phase alternating-current power supply system 4 in a connective line 16 (FIG. 2a) between coupling device 18 and insulation monitoring device 10 or in ground connection branch 14 (FIG. 2b). When neutral point S is inaccessible and coupling device 18 is directly connected to active conductors L1, L2, L3 or L1, N, respectively, measuring current transformer 20 is either disposed in ground connection branch 14 (FIG. 2c) or in connective line 16 (FIG. 2d).

Figure 2F:
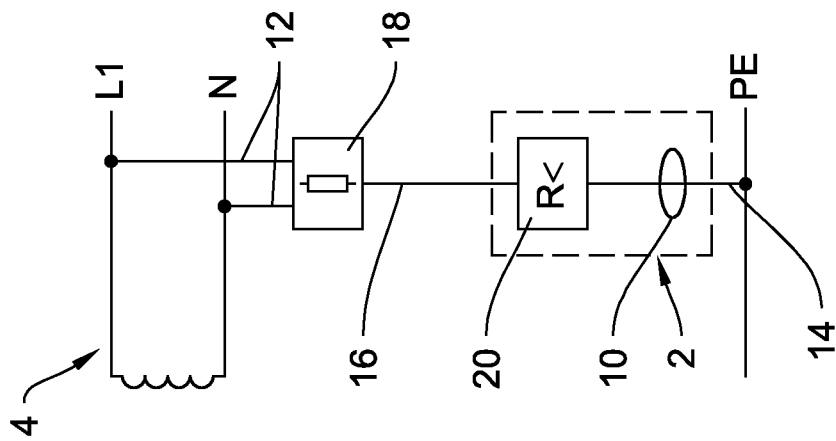
Figure 2E:
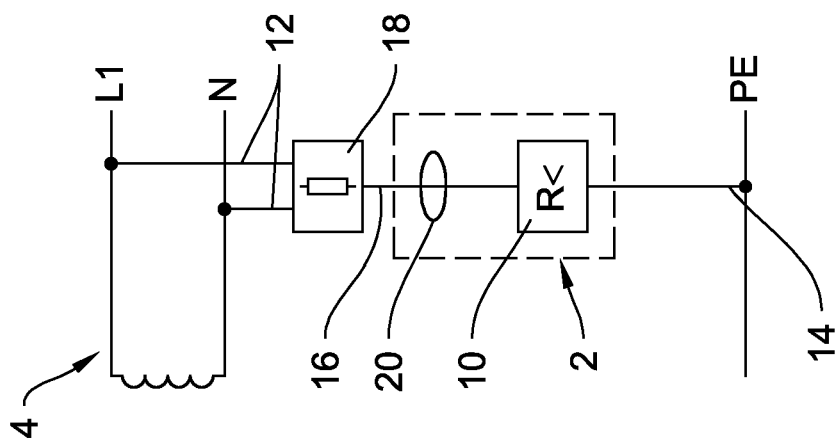
Figure 2D:
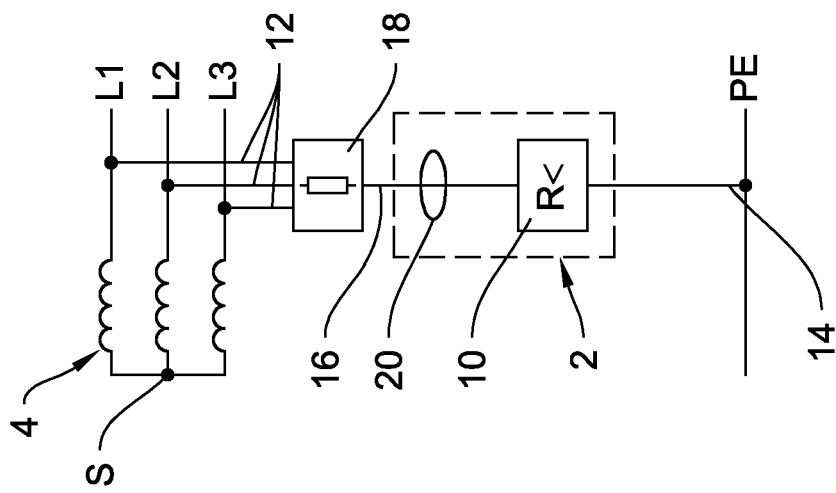

The same applies to a single-phase alternating-current power supply system 4 where measuring current transformer 20 is either switched in connective line 16 (FIG. 2e) or in ground connection branch 14 (FIG. 2f).

Figure 3C:
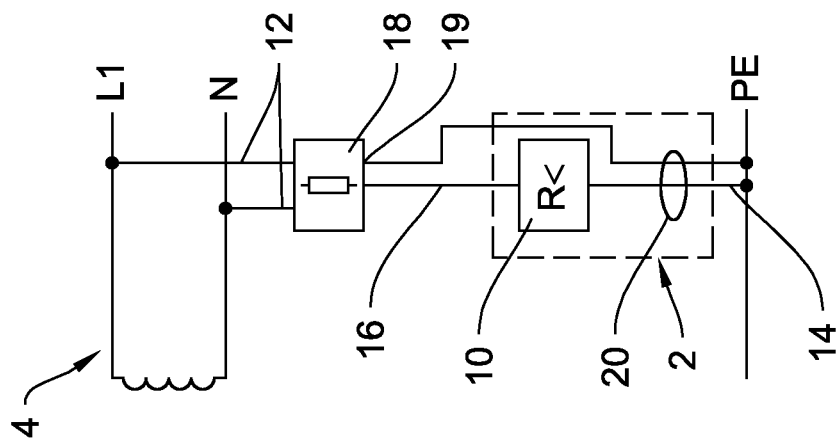
FIGS. 3a to 3c show retrofittable arrangements of a measuring current transformer in 3AC and AC power supply systems having a voltage-limiting coupling device.
Figure 3B:
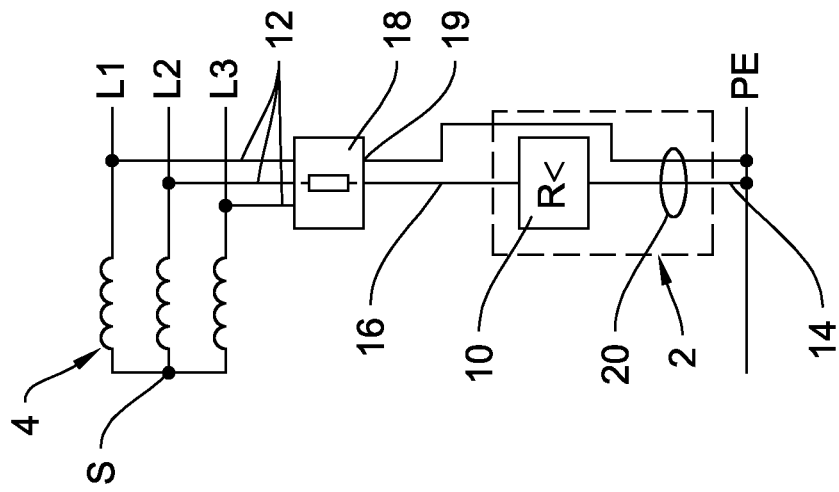
Figure 3A:
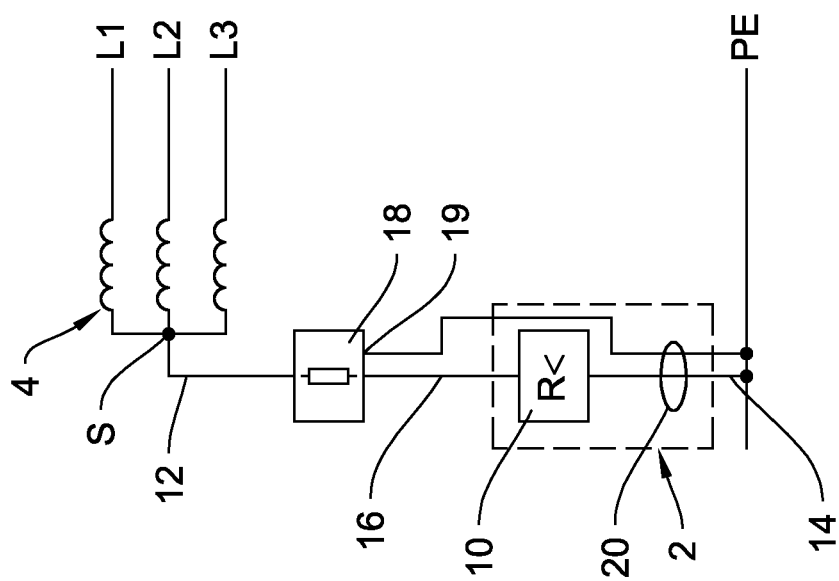

FIG. 3 shows a retrofittable arrangement of measuring current transformer 20 in a 3AC and AC power supply system 4 having a voltage-limiting coupling device 18. In this case, coupling device 18 comprises its own coupling-device ground connection 19. The fault current flowing through coupling-device ground connection 19 is detected by measuring current transformer 20 in the same manner as the fault current flowing in ground connection branch 14 of insulation monitoring device 10, namely by coupling-device ground connection 19 of coupling device 18 being guided through the toroid of measuring current transformer 20.

FIG. 4 shows retrofittable arrangements of the measuring current transformer in a direct-current power supply system 4.

In this context, measuring current transformer 20 is either disposed in ground connection branch 14 (FIG. 4a) or in coupling branches 12 (FIG. 4b) of insulation monitoring device 10.

Figure 4C:
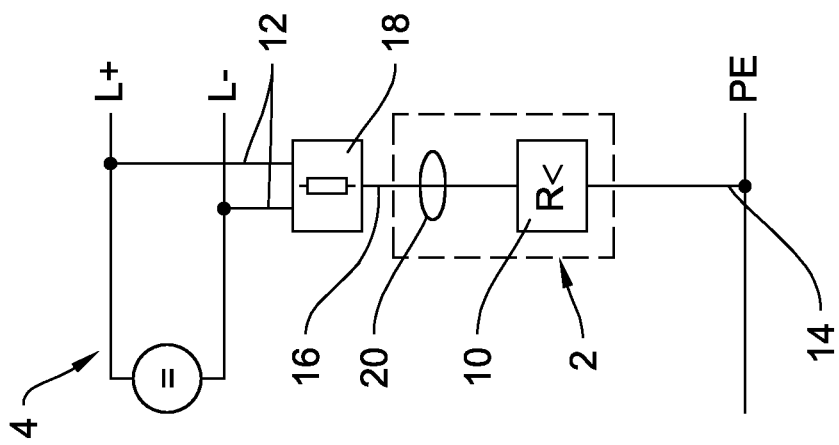
Figure 4B:
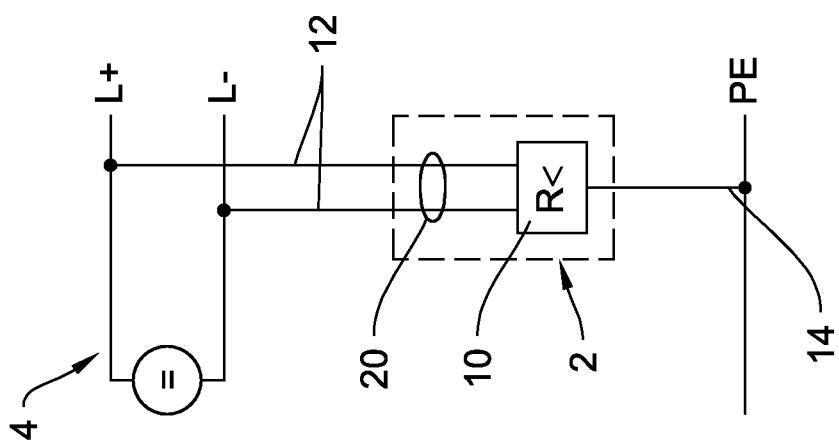
Figure 4A:
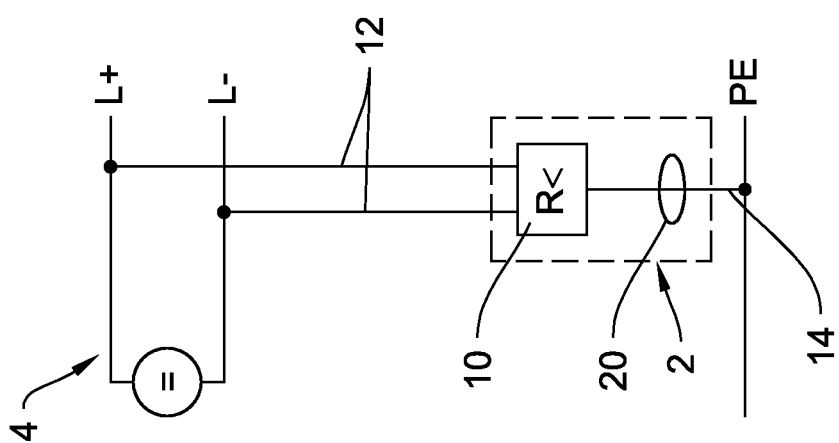

According arrangements are shown with a coupling device 18 switched upstream in FIG. 4c—having measuring current transformer 20 in connective line 16 between coupling device 18 and insulation monitoring device 10—and in FIG. 4d—having measuring current transformer 20 in ground connection branch 14.

When coupling device 18 is limited in voltage, its coupling-device ground connection 19 is also guided through the toroid of measuring current transformer 20 (FIG. 4e) in order to detect the coupling-device fault current in addition to the fault current flowing through insulation monitoring device 10.

Figure 5B:
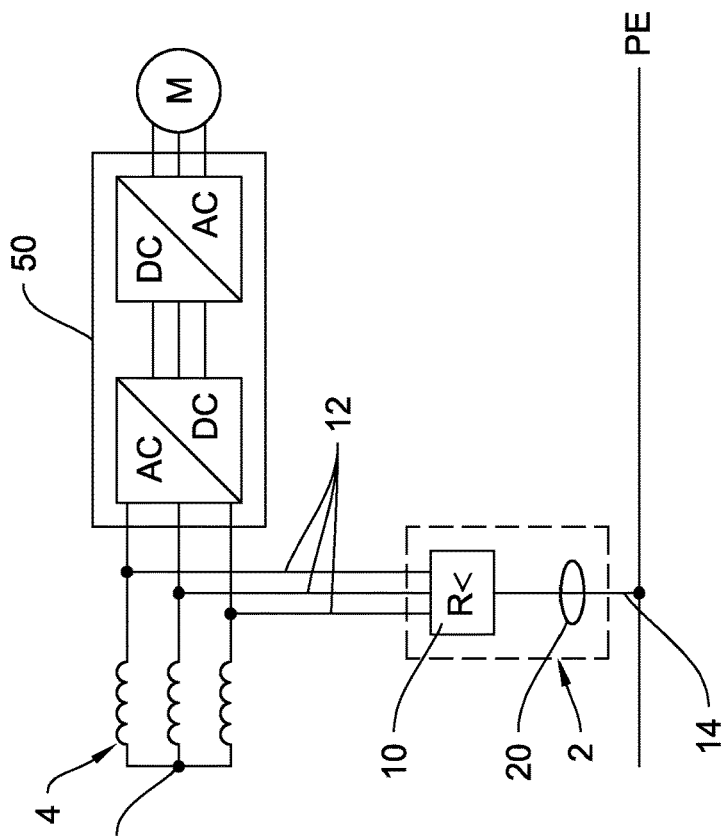
FIG. 5 shows retrofittable arrangements of a measuring current transformer in AC power supply systems having a frequency converter.
Figure 5A:
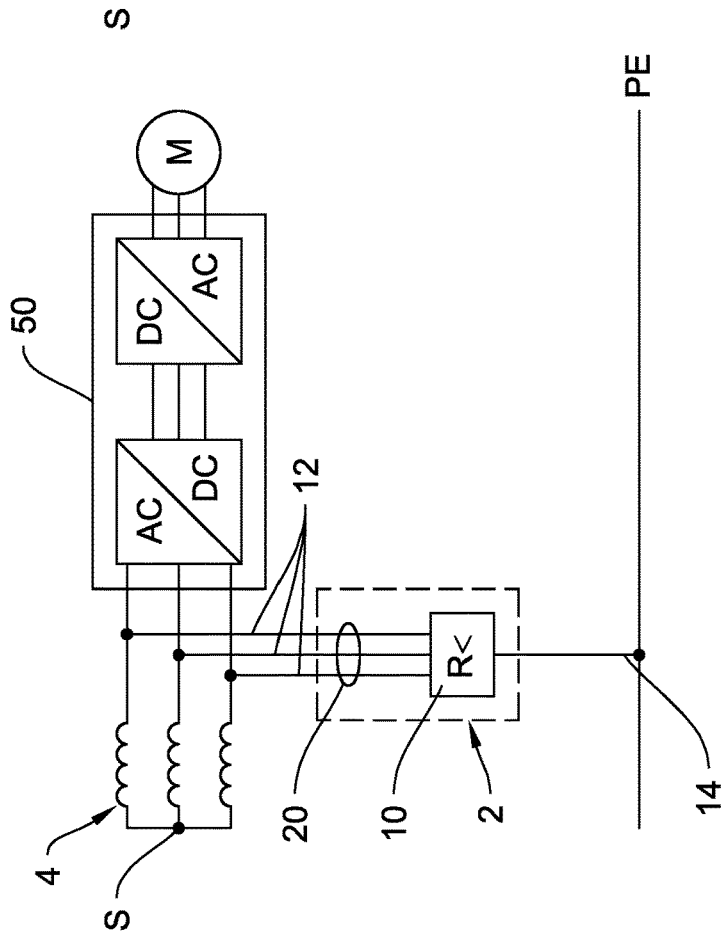

FIG. 5 shows retrofittable arrangements of measuring current transformer 20 in AC power supply systems 4 having a frequency converter 50.

The retrofitting variations shown in FIGS. 1 to 6 for galvanically isolated, AC/DC sensitive measuring current transformer 20 for additional and independent ground fault monitoring in ungrounded power supply systems 4 having insulation monitoring according to standard IEC61557-8 can also be used in the same manner in combined ungrounded AC/DC power supply systems 4, i.e., in IT networks having a frequency converter 50.

Depending on whether insulation monitoring device 10 is to be coupled to the AC feed, in the DC intermediate circuit or to the AC outlet of frequency converter 50, one of the previously shown variations for disposing measuring current transformer 20 can be chosen.

When the ground fault monitoring according to the invention in addition to the insulation monitoring is put to use in IT power supply systems 4 having frequency converter 50, a functionality, which identifies a state which is not critical to the monitored IT power supply system but can be critical to fulfilling the insulation monitoring function via insulation monitoring device 10, is added in addition to the function of the preventive, automatic emergency shut-down of the power supply in a state identified as being critical to the monitored IT power supply system. Examples for this are:
high current amplitudes in a frequency range for which used insulation monitoring device 10 is not suitable;
high current amplitudes in switching-frequency ranges of frequency converter 50 which can lead to the destruction of insulation monitoring device 10;
current amplitudes in the DC range or in the low-impedance range outside of the specification which can lead to a saturation effect when coupled to an inductive coupling device.

The functionality of an additional detection of critical states outside of the specification of insulation monitoring device 10 and/or of coupling device 18 and correspondingly derived measures, such as emitting an alarm notification and/or the preventive automatic shut-down of the power supply, permits handling erroneous applications or misuse of components for insulation monitoring in a safe and risk-minimizing manner.

In application cases with increased demand to functional safety, electric circuit arrangement 2 according to the invention can be used advantageously.

The invention claimed is:

1. An electric circuit arrangement (2) for standard insulation monitoring with emergency shut-down for an ungrounded power supply system (4) upon detection of a ground fault,
having a standard insulation monitoring device (10) configured in accordance with product standard IEC-61557-8 which is coupled to an active conductor (L1, L2, L3) of the power supply system (4) on the network side via a coupling branch (12) each or to a neutral point (S) of the power supply system (4) via a coupling branch (12) and is connected to ground (PE) on the ground side via a ground connection branch (14),
characterized by
an AC/DC sensitive measuring current transformer (20) which detects a fault current on the network side at the active conductors (L1, L2, L3) in the coupling branches (12) or at the neutral point (S) in the coupling branch (12) or on the ground side in the ground connection branch (14) of the insulation monitoring device (10); an evaluator (30) for evaluating the fault current with regard to a fault current thresh-old being exceeded; and
a trip device (40) for shutting down the power supply system (4).

2. The electric circuit arrangement (2) according to claim 1, characterized in that
the measuring current transformer (20) detects the fault current in the ground connection branch (14) of the insulation monitoring device (10) or in a connecting line (16) when using a coupling device (18) which is coupled to the active conductors (L1, L2, L3) in the coupling branches (12) or to the neutral point (S) in the coupling branch (12) and is connected to the insulation monitoring devices (10) via the connecting line (16).

3. The electric circuit arrangement (2) according to claim 2,
characterized in that
when using a coupling device (18) having a coupling-device ground connection (19), the measuring current transformer (20) additionally detects a coupling-device fault current flowing through the coupling-device ground connection (19) when detecting the fault current in the ground connection branch (14) of the insulation monitoring device (10).

\* \* \* \* \*

UNITED STATES PATENT AND TRADEMARK OFFICE
CERTIFICATE OF CORRECTION

| | |
|---|---|
| PATENT NO. | : 11,774,918 B2 |
| APPLICATION NO. | : 17/829942 |
| DATED | : October 3, 2023 |
| INVENTOR(S) | : Hackl |

It is certified that error appears in the above-identified patent and that said Letters Patent is hereby corrected as shown below:

On the Title Page

Insert item (30):
--(30) Foreign Application Priority Data
June 2, 2021 (DE) ............................ 10 2021 114 260.1--

Signed and Sealed this
Sixteenth Day of April, 2024

Katherine Kelly Vidal
*Director of the United States Patent and Trademark Office*